US006198263B1

(12) United States Patent
Chan

(10) Patent No.: US 6,198,263 B1
(45) Date of Patent: Mar. 6, 2001

(54) POWER MOSFET SWITCHING DEAD TIME CONTROL METHOD AND APPARATUS

(75) Inventor: Shufan Chan, Anaheim Hills, CA (US)

(73) Assignee: Integrated Power Technologies, Inc., Anaheim Hills, CA (US)

( * ) Notice: Subject to any disclaimer, the term of this patent is extended or adjusted under 35 U.S.C. 154(b) by 0 days.

(21) Appl. No.: 09/427,779

(22) Filed: Oct. 26, 1999

(51) Int. Cl.[7] .................................................. G05F 1/44
(52) U.S. Cl. ................................. 323/283; 363/56
(58) Field of Search .................... 323/282, 283, 323/284, 235; 363/55, 56, 16

(56) References Cited

U.S. PATENT DOCUMENTS 5,631,810 * 5/1997 Takano ............................ 323/282 X
5,747,972 * 5/1998 Baretich et al. ................. 323/283 X

* cited by examiner

Primary Examiner—Jessica Han
(74) Attorney, Agent, or Firm—Gene Scott-Patent Law Venture Group

(57) ABSTRACT

A dead time regulating apparatus is used in a switch mode power system. The apparatus, comprises a power MOSFET circuit with PMOS and NMOS devices. Driving means is connected for driving and for turning-on a delay in the MOSFETs. A time delay detecting means is connected for detecting dead time during MOSFET turn on and a pulse width comparing means is connected for receiving dead time signals and synchronous pulses for generating control signals. The control signals are directed to the driver means respectively for adjusting turn-on delays. The method of the invention provides precise dead time control in the MOSFET devices. The circuit drives the two MOSFET devices such that there is precise control of the dead time during on-off switching.

3 Claims, 2 Drawing Sheets

POWER MOSFET SWITCHING DEAD TIME CONTROL METHOD AND APPARATUS

BACKGROUND OF THE INVENTION

1. Field of the Invention

This invention relates generally to electrical circuits for the control of dead time in switching circuits, and more particularly to a power MOSFET designed for such control.

2. Description of Related Art

The following art defines the present state of this field:

The prior art teaches that in high efficiency switch-mode power systems and amplifiers using PMOS and NMOS transistors, if both are switched on at the same time there will be a conduction path between them which can result in degraded efficiency, degraded fidelity, and even destruction of the transistors. Therefore, a minimum, or near zero, dead time is introduced between the turn-on cycles of the two devices to ensure that no such conduction path exists. However, this may lead to inefficient operation and distortion. The prior art does not teach the direct control, through feedback, of an arbitrarily chosen dead time introduced into circuit operation to maximize performance. The present invention fulfills these needs and provides further related advantages as described in the following summary.

SUMMARY OF THE INVENTION

The present invention teaches certain benefits in construction and use which give rise to the objectives described below.

The present invention provides an electrical circuit design for the precise control of the dead time in a switch mode power system.

A primary objective of the present invention is to provide a switch mode power system circuit having advantages not taught by the prior art.

Another objective is provide such a circuit having precise dead time control.

A further objective is to enable the use of such a circuit whereby distortion is minimized and overall amplifier efficiency is enhanced.

Other features and advantages of the present invention will become apparent from the following more detailed description, taken in conjunction with the accompanying drawings, which illustrate, by way of example, the principles of the invention.

BRIEF DESCRIPTION OF THE DRAWING

The accompanying drawings illustrate the present invention. In such drawings.

DETAILED DESCRIPTION OF THE INVENTION

Figure 1:
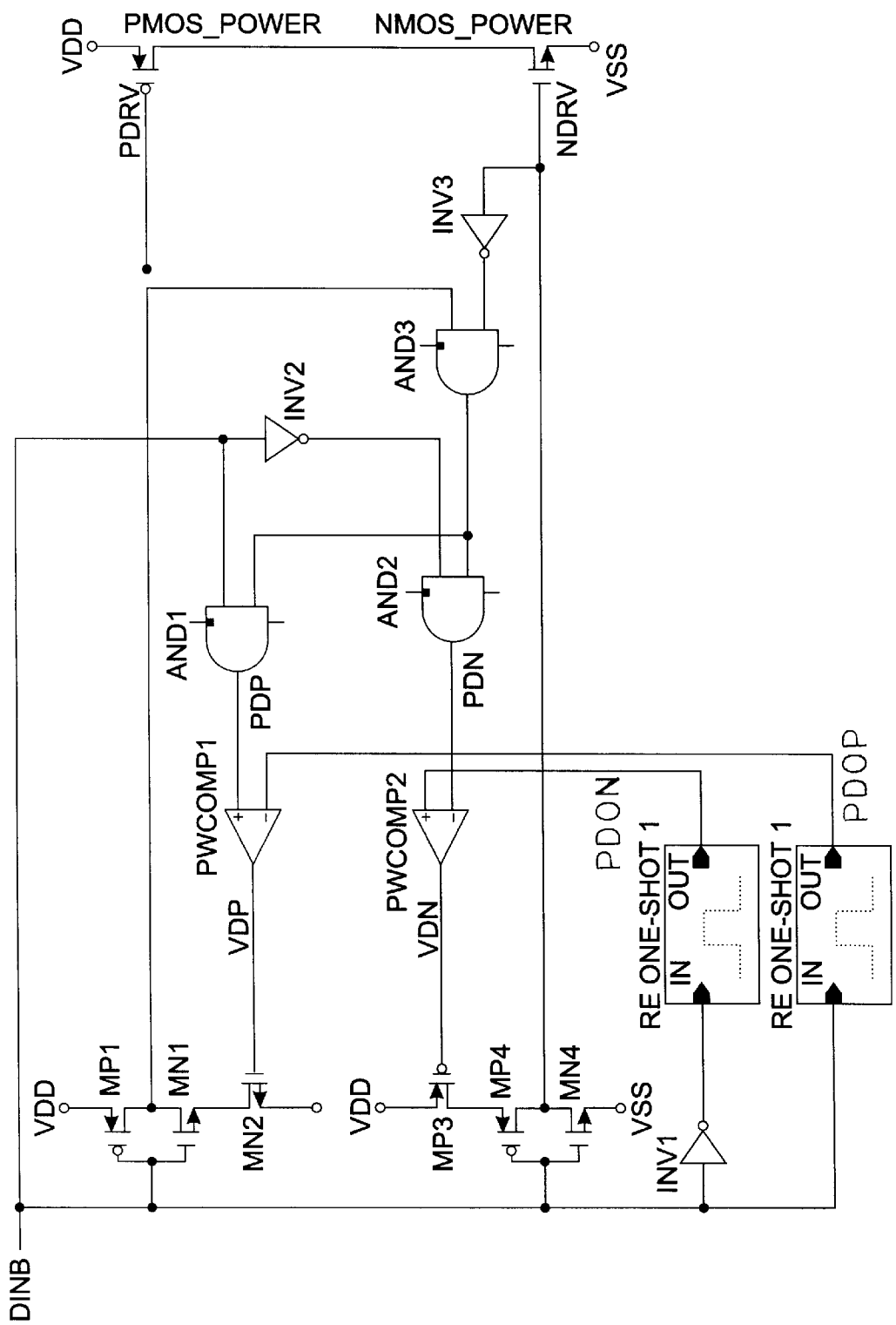
FIG. 1 is an electrical schematic diagram of a circuit according to the present invention.

The above described drawing figures illustrate the invention, a dead time regulating apparatus used in a switch mode power system. The apparatus, as shown in FIG. 1, comprises an upper and a lower circuit arms having an upper and a lower circuit arm power MOSFETs respectively. An upper and a lower driving means is connected for driving and for turning-on a delay in the upper and lower circuit arm power MOSFETs respectively through a control terminal. An upper and a lower dead time detecting means is connected for detecting dead time during MOSFET turn on in the upper and the lower circuit arms respectively and an upper and a lower pulse width comparing means is connected for receiving dead time signals and synchronous pulses for generating control signals from the upper and the lower dead time detecting means respectively. The control signals are directed to the upper and the lower driver means respectively for adjusting turn-on delays therein. FIG. 1 is merely one embodiment possible for the implementation of the concept of the present invention. Here it is shown how the method of the invention is implemented for the precise dead time control in the MOSFET devices. PMOS-Power and NMOS-Power are output power switches used to deliver power from the present invention circuit to a load. The circuit drives these two MOSFET devices such that there is precise control of the dead time during on-off switching. DINB is an input signal to the circuit and controls the output switches.

MP1, MN1 and MN2 form a subcircuit that drives the PMOS-Power output switch such that turn-on delay is adjustable and the turn-off delay is near zero. VDP is the control signal that adjusts the turn-on delay. Likewise, MP2, Mn3 and MN4 for a second subcircuit for driving the NMOS-Power switch with adjustable turn-on delay and near zero turn-off delay. VDN is the control signal that adjusts the turn-on delay. By adjusting the transistor turn-on delay one can effectively adjust the dead time.

AND1, AND2, AND3, INV2 and INV3 form a subcircuit that generates two output signals: PDP and PDN. PDP is a digital pulse signal that represents the dead time of the PMOS-Power transistor during turn-on, after the NMOS-Power transistor turns off. Likewise, PDN is a digital pulse signal that represents the dead time of the NMOS-Power transistor during turn-on, after the PMOS-Power transistor turns off.

RE ONE-SHOT1 is a rising edge-triggered one-shot whose output pulse width represents the desired dead time for the PMOS-Power transistor. Likewise, RE ONE-SHOT2 is a rising edge-triggered one-shot whose output pulse width represents the desired dead time for the NMOS-Power transistor.

Figure 2:
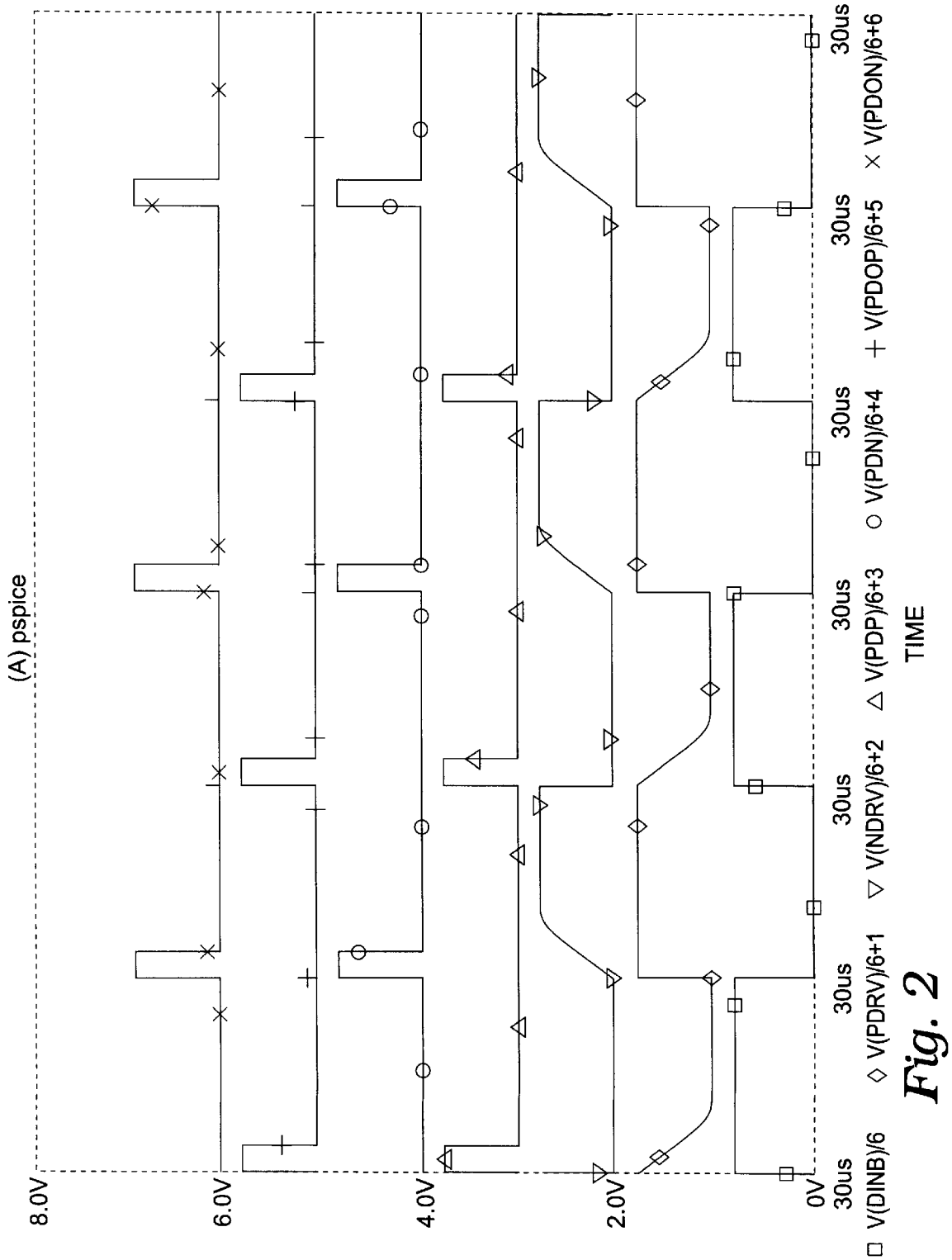
FIG. 2 is a dead time control timing diagram thereof.

PWCOMP1 is a pulse width comparitor that compares the pulse width of PDP and PDOP and generates an error signal VDP for adjusting the turn-on delay for the PMOS-Power transistor. Likewise, PWCOMP2 is a pulse width comparitor that compares the pulse width of PDN and PDON and generates an error signal VDN for adjusting the turn-on delay for the NMOS-Power transistor. Using negative feedback, PWCOMP1 and PWCOMP2 regulate the turn-on delay, i.e., the dead time, of the output power switches to equal the pulse width of the RE ONE-SHOT1 and RE ONE-SHOT2 respectively. FIG. 2 is a dead time control circuit timing diagram and illustrates the timing in the circuit. In this figure it is noted that seven voltages are represented. Referring to FIG. 1 for locations in the circuit for the various voltages, in FIG. 2 the square (bottom signal) is used to represent DINB, the diamond is used to represent PDRV, the point-down triangle is used to represent NDRV, the point-up triangle is used to represent PDP, the circle is used to represent PDN, the plus sign is used to represent PDOP and the letter "x" is used to represent PDON.

The method of the present invention is clear from the above description, however, the method comprises certain steps which are more particularly described below. In a switch mode power system, a dead time regulating method comprises the steps of providing a circuit including an upper and a lower circuit arms having an upper and a lower circuit arm power MOSFETs respectively; turing-on a delay in the upper and lower circuit arm power MOSFETs through an upper and a lower driving means respectively; detecting dead time during MOSFET turn on in the upper and the lower circuit arms through an upper and a lower dead time detecting means respectively; receiving dead time signals and synchronous pulses through an upper and a lower pulse width comparing means respectively; generating control signals from the upper and the lower dead time detecting means respectively; and directing the control signals to the upper and the lower driver means respectively for adjusting turn-on delays therein.

While the invention has been described with reference to at least one preferred embodiment, it is to be clearly understood by those skilled in the art that the invention is not limited thereto. Rather, the scope of the invention is to be interpreted only in conjunction with the appended claims.

What is claimed is:

1. In a switch mode power system, a dead time regulating apparatus comprising:

an upper and a lower circuit arms having an upper and a lower circuit arm power MOSFETs respectively;

an upper and a lower driving means connected for driving and for turning-on a controllable delay in the upper and lower circuit arm power MOSFETs respectively;

an upper and a lower dead time detecting means connected for detecting dead time during MOSFET turn on in the upper and the lower circuit arms respectively;

an upper and a lower pulse width comparing means connected for receiving dead time signals and synchronous pulses for generating control signals from the upper and the lower dead time detecting means respectively, the control signals directed to the upper and the lower driver means respectively for adjusting turn-on delays therein.

2. In a switch mode power system, a dead time regulating method comprises the steps of:

a) providing a circuit including an upper and a lower circuit arms power MOSFETs respectively;

b) turning-on a delay in the upper and lower circuit arm power MOSFETs through a an upper and a lower driving means respectively;

c) detecting dead time during MOSFET turn on through an upper and a lower dead time detecting means respectively;

d) receiving dead time signals and synchronous pulses through an upper and a lower pulse width comparing means respectively;

e) generating control signals from the upper and the lower dead time detecting means respectively; and f) directing the control signals to the upper and the lower driver means respectively for adjusting turn-on delays in the MOSFETs.

3. In a switch mode power system, a dead time regulating apparatus comprising:

at least one PMOS transistor and at least one NMOS transistor in an electrical circuit;

a driving means connected for driving and for turning on the transistors;

a dead time detecting means connected for detecting dead time during the turning-on of the transistors and for generating related dead time signals;

a pulse width comparing means connected for receiving the dead time signals and synchronous pulses for generating control signals, the control signals directed for adjusting turn-on delays in the circuit such that the PMOS and the NMOS transistors do not conduct at the same time.

* * * * *